United States Patent
McKay

[11] Patent Number: 5,945,734
[45] Date of Patent: Aug. 31, 1999

[54] WIRE-BOND FREE INPUT/OUTPUT INTERFACE FOR GAAS ICS WITH MEANS OF DETERMINING KNOWN GOOD DIE

[75] Inventor: Thomas G. McKay, Felton, Calif.

[73] Assignee: Samsung Electronics Co., Ltd., Seoul, Rep. of Korea

[21] Appl. No.: 08/934,391

[22] Filed: Sep. 19, 1997

[51] Int. Cl.$^6$ .................... H01L 23/22; H01L 23/24
[52] U.S. Cl. ................ 257/687; 257/698; 257/728; 257/774; 257/787
[58] Field of Search ........................ 257/687, 688, 257/698, 728, 774, 776, 787

[56] References Cited

U.S. PATENT DOCUMENTS

| | | | |
|---|---|---|---|
| 5,312,765 | 5/1994 | Kanber | 437/22 |
| 5,343,071 | 8/1994 | Kazior et al. | 257/621 |
| 5,347,149 | 9/1994 | Bayvaktaroglu | 257/192 |
| 5,352,998 | 10/1994 | Tanino | 333/247 |
| 5,406,125 | 4/1995 | Johnson et al. | 257/774 |
| 5,510,758 | 4/1996 | Fujita et al. | 257/728 |
| 5,528,209 | 6/1996 | Macdonald et al. | 333/247 |
| 5,614,743 | 3/1997 | Mochizuki | 257/276 |
| 5,694,300 | 12/1997 | Mattei et al. | 361/818 |
| 5,717,231 | 2/1998 | Tserng et al. | 257/276 |

*Primary Examiner*—Ngân V. Ngô
*Attorney, Agent, or Firm*—Townsend and Townsend and Crew LLP

[57] ABSTRACT

An MMIC includes I/O pads on the back side coupled to active circuit structures on the front side by standard through-the-substrate vias. The front side is covered by a passivation layer and the back side I/O pads facilitate testing utilizing standard wafer probing equipment. The back side I/O pads are formed utilizing standard MMIC process technology.

2 Claims, 3 Drawing Sheets

WIRE-BOND FREE INPUT/OUTPUT INTERFACE FOR GAAS ICS WITH MEANS OF DETERMINING KNOWN GOOD DIE

BACKGROUND OF THE INVENTION

The present invention relates generally to semiconductor device fabrication and more particularly to forming contacts to circuit structures on a GaAs monolithic microwave integrated circuit (MMIC).

Various techniques, including wire-bonding and emerging flip-chip and TAB (Tape-Automated-Bonding) technology, have been utilized to form contacts with circuit structures on the front side of an MMIC.

Electrical interconnection between a wire-bonded MMIC and the next level of packaging, e.g., a printed circuit board (PCB) is accomplished using a plastic microcircuit package usually consisting of copper leads, multiple wire bonds, and an epoxy encapsulant. MMIC pads are connected internally to package leads with the wire bonds.

However, because of its complexity and unreliability wire-bonding is being replaced by new emerging technologies.

Typically, backside processing includes polishing to thin the substrate to several mils in thickness, the formation of via holes to connect to circuit structures on the front face to be grounded, e.g., the source terminal of an MESFET, and plating the back surface to form a ground plate.

In the case of emerging flip-chip technologies and concepts, the MMIC input/output pads on the front side of the substrate are plated with thick metalization, up to several hundred microns thick, to form bumps. These bumps on the MMIC are used to connect to the PCB by turning the device over (front side down) and soldering the bumps to the PCB conductors. The bumps must be heavily plated so active circuitry on the front side of the MMIC will not be damaged when the MMIC is mounted.

An important part of the manufacturing process is establishing Known Good Die (KGD). However, establishing KGD is problematic for Chip-on-Board (COB) technologies such as Flip-Chip-on-Board because functional testing must be carried out after the last process step is completed. Standard wafer probing equipment cannot be used with bump technologies to perform this functional testing because the bumps are very thick, rounded, and/or have geometry not conducive to standard wafer probing equipment. Accordingly, elaborate techniques such as placing die on a test board, soldering, testing, and then de-soldering have been established to solve the KGD problem for flip-chip mounted ICs.

Accordingly, there is a need for a contact technology to replace wire bonding that facilitates efficiently establishing KGD.

SUMMARY OF THE INVENTION

According to one aspect of the invention, input/output pads to circuit structures on the front side of an MMIC are formed on the back side utilizing standard, through-the-substrate via holes. The input/output pads are available for connection to PCB circuitry or other next level assembly.

According to another aspect of the invention, the backside pads are formed with lift-off of a thin metal and selective plating.

According to another aspect of the invention, the front side of MMIC is coated with a dielectric passivation film.

According to another aspect of invention, standard wafer probing equipment is utilized to establish KGD because the backside input/output pads are substantially planar and their geometry is conducive to using standard wafer probing equipment.

Other features and advantages of the invention will be apparent in view of the following detailed description and appended drawings.

DETAILED DESCRIPTION OF THE PREFERRED EMBODIMENTS

Figure 1A:
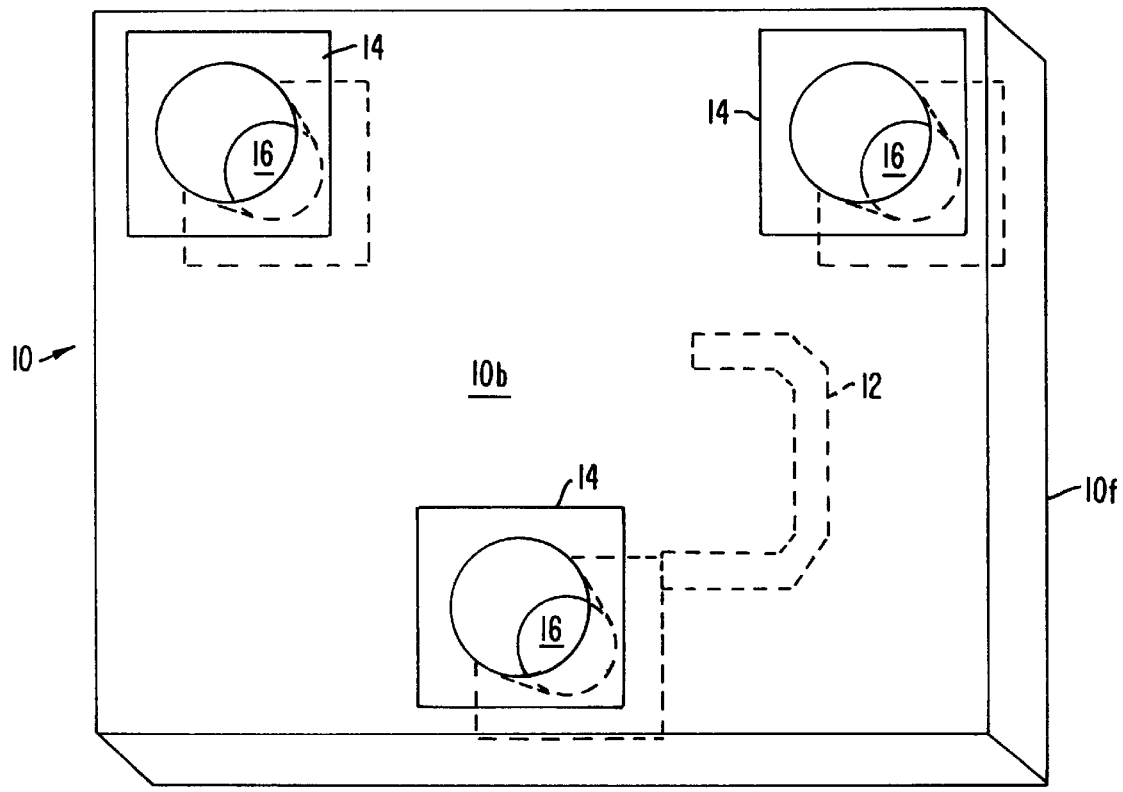
FIGS. 1A and 1B are, respectively, a perspective top view and a side view of a preferred embodiment of the invention.
Figure 1B:
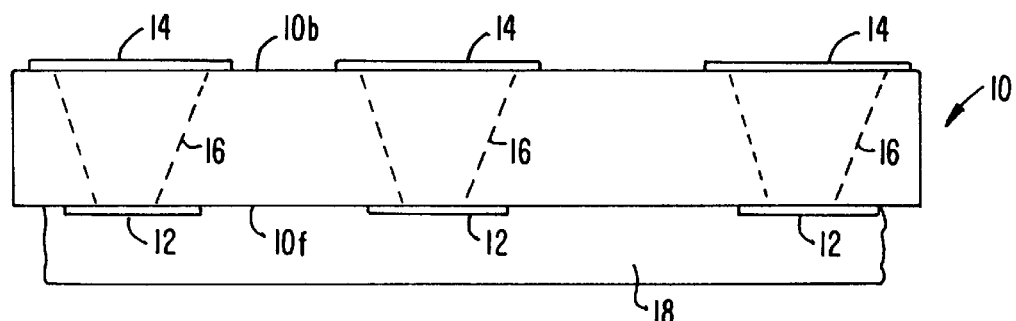

FIGS. 1A and 1B are, respectively, top perspective and side views of a preferred embodiment of the invention. Referring to those figures, an MMIC 10 includes a front side 10f and a back side 10b. Circuit structures 12 formed on the front side 10f of the MMIC 10 are connected to I/O pads 14 formed on the back side 10b of the MMIC 10 through via holes 16. The front side of the MMIC is covered with a passivation layer 18.

As is well-known, through-the-substrate via holes 16 are formed from the back side 10b utilizing standard GaAs MMIC techniques such as Reactive Ion Etch (RIE). When the back side 10b is plated the inside of the via holes are plated to form a contact with structures on the front side.

The pattern of I/O pads can be formed utilizing a lift-off of a thin metal and selective plating. In FIG. 1A, a layer of photoresist is deposited on the backside 10b of the substrate and patterned to remove the photoresist from areas where I/O pads 14 are to be formed. A thin film of metal is then deposited over the back side 10b. As is well-known, the metal is deposited along the inside of the via holes 16 to form a conductive path to the circuit structures 12 on the front side 10f. The resist is then removed so only the metal film deposited directly on the substrate, i.e., on the locations of the I/O pads 14, remains. The metal films are then plated to the desired thickness using standard techniques.

The passivation layer 18 on the front side of MMIC 10 is of sufficient thickness and mechanical rigidity to protect the device through subsequent handling and assembly onto a circuit board. Thus a package, as in the case of wire-bonding, is not required. In a preferred embodiment passivation layer 18 is formed of a dielectric layer such at Cyclotene™.

Figure 2:
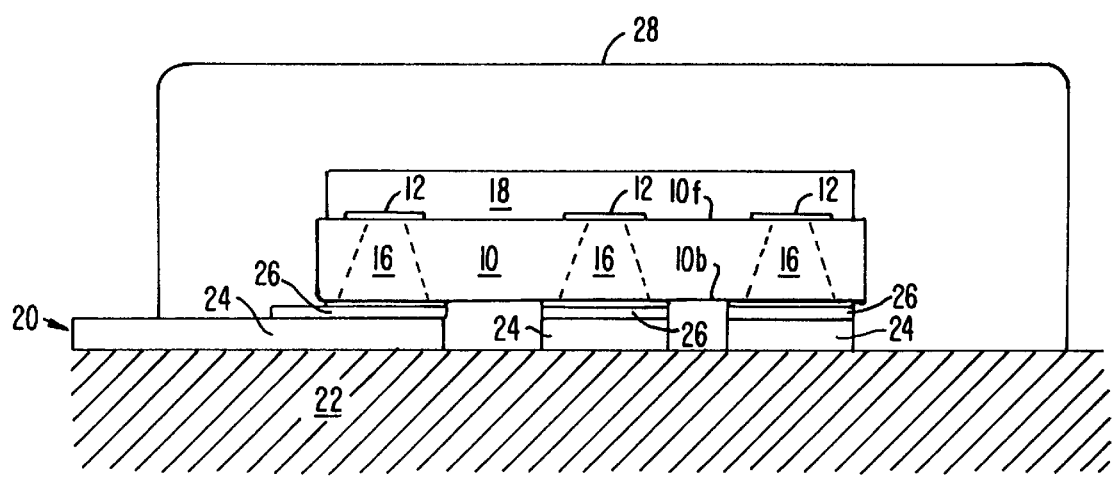
FIG. 2 is a side view of the preferred embodiment of the MMIC mounted on a printed circuit board.

FIG. 2 depicts a preferred embodiment of the wire-bond free MMIC mounted to a printed circuit board (PCB). A PCB 20 includes a PCB substrate 22 and a PCB metalization conductor 24. The I/O pads 16 of the MMIC are bonded to the PCB metalization conductor 24 which are coated by, for example, solder paste or conductive epoxy 26. The mounted MMIC is covered by a PCB level encapsulant 28.

The die can be shipped to chip-on-board assembly houses on a scribe or saw frame in the back side up configuration. The die are then turned over by automatic pick-and-place equipment and place on the solder paste or conductive epoxy coated conductors 24 on the PCB 20.

Note that the MMIC is in the upright position when mounted on the PCB 20 so that PCB level encapsulation of the sensitive active device circuitry on the front side is easily achieved. This is in contrast to flip-chip technology, where the bumps are formed on the front surface and the front surface is down when the flip-chip is mounted on the PCB. In the case of flip-chip, it is difficult to get the encapsulant between the front side of the MMIC and the PCB board.

Also, in flip-chip the I/O bumps are formed on the front side and have to be heavily plated to extend beyond the level of the active devices on the front side. In contrast, in the present system the plating does not have to be heavy and fits the standard GaAs MMIC process flow without gross modification.

Additionally, with the present system interconnect electrical parasitics (inductance) are much smaller than when the device is packaged or when COB and wire bonds are used. This enables higher gain per IC (increased stability), higher bandwidth input-output ports, improved impedance control at the PCB assembly level.

A major advantage of the present system is simplification of establishing KGD (Known-Good-Die). Radio Frequency (RF) testing of each die is more easily performed using standard microwave probe equipment, since the pads are planar, of tightly (±2 micron) controlled geometry and the die location upon process completion (scribe or saw and separate) is well controlled. The amount of control necessary upon process completion may be in the neighborhood of ±10 microns without pattern-recognition-assisted or operator-assisted automatic electrical probing.

Post-package RF functional test and associated high frequency RF and microwave electromechanical issues are eliminated. Instead of low contact life test sockets, wafer probes are used to evaluate functionality of the end of all IC processing. Test port bandwidth can be very high, approximately 40 GHz, rather than 2–3 GHz available in socket form.

Figure 3:
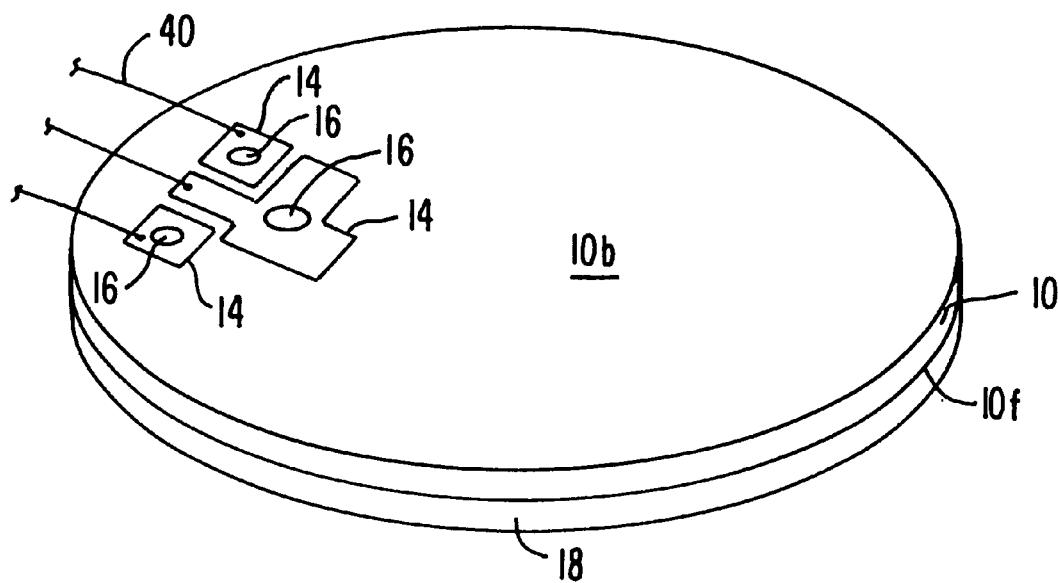
FIG. 3 is a depiction of a wafer being tested utilizing standard wafer probing equipment.
Figure 4:
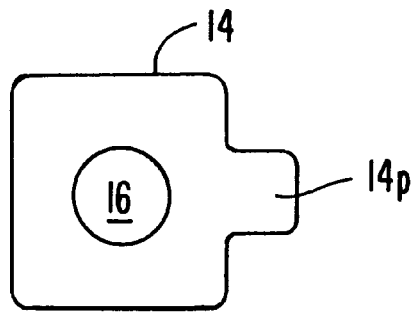
FIG. 4 is a view of a backside I/O pad having a probe area.

FIG. 3 illustrates utilizing standard probes to contact I/O pads formed on the back side of the MMIC. The probes 40 are placed on the edges of the I/O pads 16 to prevent chipping the via holds 16. In FIG. 4 an I/O pad pattern having a small probe area 14*p* for facilitating testing is depicted.

The invention has now been described with reference to the preferred embodiments. Alternatives and substitutions will now be apparent to persons of skill in the art. Accordingly, it is not intended to limit the invention except as provided by the appended claims.

What is claimed is:

1. An MMIC circuit structure comprising:

a semiconductor substrate having a front side and a back side;

a plurality of microwave circuit structures formed on the front side of said substrate;

a like plurality of through-the-substrate via holes, each associated with a respective microwave circuit structure;

a like plurality of electrically isolated metalized regions formed on the back side of said substrate, with each metalized area disposed below a corresponding one of said circuit structures and associated with one of said vias, with each metalized region conductively coupled to an associated microwave circuit structure through an associated via, with said semiconductor substrate, metalized regions, and vias forming an MMIC;

a printed circuit board comprising a substrate with conductors formed thereover with the metalized regions formed on the backside of said semiconductor substrate coupled to the conductors of said printed circuit board to mount said unflipped MMIC front side up; and a printed circuit encapsulant covering said MMIC mounted on said printed circuit board.

2. The MMIC of claim 1 further wherein:

said metalized regions are substantially planar and adapted for coupling with standard microwave probes.

* * * * *